United States Patent [19]

Rusch et al.

[11] Patent Number: 4,633,572
[45] Date of Patent: Jan. 6, 1987

[54] PROGRAMMING POWER PATHS IN AN IC BY COMBINED DEPLETION AND ENHANCEMENT IMPLANTS

[75] Inventors: Randy A. Rusch, Kokomo; Douglas A. Kittle, Sharpsville; Bernhard G. Ulfers, Logansport; Stephen L. Inman, Kokomo, all of Ind.

[73] Assignee: General Motors Corporation, Detroit, Mich.

[21] Appl. No.: 790,382

[22] Filed: Oct. 23, 1985

Related U.S. Application Data

[62] Division of Ser. No. 468,352, Feb. 22, 1983.

[51] Int. Cl.$^4$ .................. H01L 21/263; H01L 21/80
[52] U.S. Cl. .................. 29/576 B; 29/571; 29/577 C; 148/1.5; 148/187; 357/23.4; 357/91
[58] Field of Search ............. 29/576.13, 571, 577 C; 148/1.5, 187; 357/23 D, 91

[56] References Cited

U.S. PATENT DOCUMENTS

| | | | |
|---|---|---|---|
| 3,475,234 | 10/1969 | Kerwin et al. | 357/23.9 |
| 3,751,722 | 8/1973 | Richman | 357/23.11 |
| 3,914,855 | 10/1974 | Cheney et al. | 357/45 |
| 4,025,799 | 5/1977 | Cox et al. | 307/465 |
| 4,032,894 | 6/1977 | Williams | 307/303 |
| 4,033,026 | 7/1977 | Pashley | 357/41 |
| 4,059,826 | 11/1977 | Rogers | 357/91 |
| 4,075,045 | 2/1978 | Rideout | 357/41 |
| 4,078,947 | 3/1978 | Johnson et al. | 357/91 |
| 4,085,498 | 4/1978 | Rideout | 357/41 |
| 4,145,233 | 3/1979 | Sefick et al. | 148/1.5 |
| 4,183,040 | 1/1980 | Rideout | 357/41 |
| 4,193,079 | 3/1980 | Yeh | 357/90 |
| 4,204,131 | 5/1980 | Dozier | 307/304 |
| 4,210,465 | 7/1980 | Brower | 357/59 |
| 4,212,684 | 7/1980 | Brower | 357/41 |
| 4,217,149 | 8/1980 | Sawazaki | 357/91 |
| 4,230,504 | 10/1980 | Kuo | 357/41 |
| 4,290,184 | 9/1981 | Kuo | 357/91 |
| 4,317,275 | 3/1982 | Dozier | 29/571 |
| 4,384,350 | 5/1983 | Kee et al. | 365/229 |
| 4,403,395 | 9/1983 | Curran | 29/571 |
| 4,441,036 | 4/1984 | Oldham | 357/29 |
| 4,445,205 | 4/1984 | Ebel | 365/227 |
| 4,459,660 | 7/1984 | Bellay et al. | 365/222 |
| 4,472,871 | 9/1984 | Green et al. | 29/571 |
| 4,486,944 | 12/1984 | Hardee | 29/577 C |
| 4,514,894 | 5/1985 | Kawagoe | 29/571 |
| 4,549,336 | 10/1985 | Sheppard | 29/576 B |
| 4,554,729 | 11/1985 | Tanimura et al. | 29/577 C |

FOREIGN PATENT DOCUMENTS 57-23123  2/1982  Japan .................. 365/229

*Primary Examiner*—Upendra Roy
*Attorney, Agent, or Firm*—Robert J. Wallace

[57] ABSTRACT

An enhancement implant used in late programming of a ROM in an integrated circuit is combined with a depletion implant used much earlier in the fabrication process to also permit late programming of power paths in the integrated circuit. The implants must be matched and the IC heated after the enhancement implant.

4 Claims, 6 Drawing Figures

PROGRAMMING POWER PATHS IN AN IC BY COMBINED DEPLETION AND ENHANCEMENT IMPLANTS

RELATED PATENT APPLICATION

This is a division of application Ser. No. 468,352 filed on Feb. 22, 1983.

FIELD OF THE INVENTION

This invention relates to late programming of insulated gate field effect transistor type integrated circuits. More specifically, this invention relates to late programming of power paths in an integrated circuit, without requiring that additional steps be added to the fabrication process.

BACKGROUND OF THE INVENTION

It is known to reserve programming of memories in an insulated gate transistor type of integrated circuit until late in the process of making the integrated circuit. Such processes typically involve ion implantation through polycrystalline silicon gate electrodes, to selectively adjust threshold voltages of particular insulated gate transistors in a memory matrix. If the memory matrix is of depletion type transistors, the programming implant reduces threshold voltage of selected transistors to below a predetermined operating voltage for the matrix. One reduces insulated gate transistor threshold voltage by implanting the channel region with ions of a conductivity type the same as that of its source and drain. We refer to an implant for reducing threshold voltage as a depletion implant.

However, in most instances the memory matrix is of enhancement type transistors. In such instance one programs the matrix with an implant that selectively raises, not reduces, the threshold voltage of the selected transistors above a predetermined operating voltage for the matrix. One increases the threshold voltage of an insulated gate transistor by implanting its channel with ions of a conductivity type opposite to that of its source and drain. We refer to an implant that increases threshold voltage as an enhancement implant.

Late programming is described in U.S. Pat. No. 4,294,209 and 4,299,862 to Donnelly. Also, late programming processes are described in detail in the earlier-filed U.S. patent application Nos. 252,203 by Donnelly, and 268,086, 268,088, 268,089 and 268,090 by Dickman et al. All of the foregoing patents and patent applications involve using an implant to program a read-only memory (ROM) matrix of enhancement-type insulated gate transistors. We also recognize that it is known to use an enhancement implant to program peripheral circuitry at the same time a ROM is being programmed.

We have now found that if one matches the depletion and enhancement implants and if one coordinates these implants with heating of the integrated circuit after the enhancement implant, one can program in still another way. In fact, one can even program power supply paths to various portions of the integrated circuit at the same time the ROM is being programmed. It is performed late in the fabrication process, and no added process steps are required.

Objects and Summary of the Invention

It is therefore an object of the invention to provide an improved method of late programming that permits one to reserve power supply path selection until late in the process of making the integrated circuit.

A further object of the invention is to provide a method of late programming that can be used for simultaneous programming of a ROM and of power supply paths in an integrated circuit.

Another object of the invention is to provide a method of matching depletion and enhancement implants, and coordinating them with subsequent heating, to provide late programming in an integrated circuit without adding steps over those already used to late program a ROM on that integrated circuit.

Still another object of the invention is to provide an integrated circuit programmed by the aforementioned methods.

The invention specifically contemplates matching the enhancement implant of a dose at least an order of magnitude greater than that of the depletion implant. Moreover, the enhancement implant ion must have a diffusion rate at least three times as fast as the depletion implant ion. Also, the depth of the enhancement implant should at least be as deep as that of the depletion implant. Further, the enhancement implant should be performed early enough in the integrated circuit fabrication process to permit subsequent process steps to provide enough heat to diffuse the enhancement implant ions as deeply as the depletion implant ions are diffused. Otherwise an additional heating step must be provided in the process. In substance, the depletion implant provides multiple parallel paths by forming electrically parallel depletion transistors. The enhancement implant makes one of these depletion transistors non-conducting at the operating voltage applied.

BRIEF DESCRIPTION OF THE DRAWING

Other objects, features and advantages of this invention will become more apparent from the following description of preferred examples thereof and from the drawing in which.

DESCRIPTION OF THE PREFERRED EMBODIMENTS

In this invention we can include a random-access memory (RAM) in an integrated circuit and easily provide different versions of it with alternative sources of power. For example, in some versions of a given integrated circuit chip we may want the RAM powered by a standby power supply. In other versions of the integrated circuit we may want the RAM powered by a main power supply. we may not know how many of each version we will need at the time production must start. In such event it is convenient to provide two separate contact pads on the chip, and an electrical current flow path from each pad to the RAM. In this invention, a depletion type transistor is serially included in each electrical current flow path. One of the depletion type transistors can be exposed during the enhancement implant to raise its threshold voltage above the power supply voltage. This effectively makes that depletion transistor inoperative in one current flow path. In such event the RAM is electrically isolated from the power supply connected to the control pad associated with that current flow path. Thus the RAM receives power only from the other power supply.

We have found that a depletion transistor will more than satisfactorily handle the power required for RAM operation. It need only be enlarged, usually at least three times, over the size of depletion transistors used in other portions of the integrated circuit, as for example a load resistor in a ROM. In addition, we have found that satisfactory results are only obtained when one insures that the dopant from the enhancement implant is high enough in concentration and diffuses fast enough to compensate the full penetration of dopant from the depletion implant.

Figure 1:
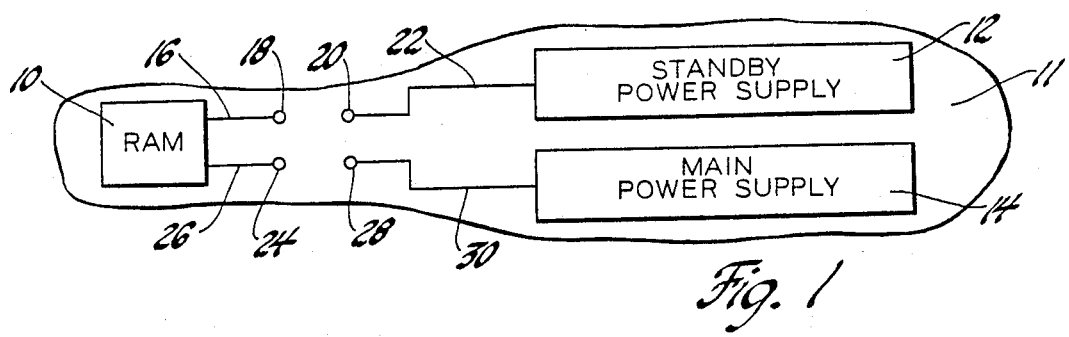
FIGS. 1 through 6 show block diagrams illustrating successive steps in a specific example of this invention.

FIG. 1 shows a random-access memory (RAM) portion 10 of an insulated gate field effect transistor type of integrated circuit 11. The integrated circuit would, of course, be but one chip of a wafer containing a plurality of such integrated circuits. The integrated circuit also includes standby power supply circuitry and/or a contact pad that are designated by reference numeral 12. It also includes main power supply circuitry and/or a contact pad that are designated by reference numeral 14. RAM 10 is connected to the standby power supply 12 by means of a conductor 16 that is connected to source region 18 of a depletion type transistor. The drain region 20 of that depletion type transistor is connected to conductor 22 that is, in turn, connected to the standby power supply 12. Analogously RAM 10 is in low resistance electrical communication with a source region 24 of a second depletion type insulated gate field effect transistor through conductor 26. The drain region 28 of that second depletion type insulated gate field effect transistor is in low resistance electrical communication with the main power supply 14 by means of conductor 30.

Depletion type transistors are normally included in an insulated gate type of integrated circuit. They are used, for example, as load resistors in read-only memories (ROMs). By depletion transistor we mean an insulated gate field effect transistor having its channel region between its source and drain doped to the same conductivity type as its source and drain. In addition, the source and gate of such devices are generally electrically shorted. In other words, the source and gate electrodes are in low electrical resistance communication with one another. We have found that such devices, if enlarged satisfactorily, can be of sufficiently low resistance to serve in a power supply line for a RAM. In general, for larger size RAMs the enlargement should be to a channel width at least three times, and preferably five times, the width of depletion transistors used as load, or current limiting transistors of the same channel length in a ROM in the same integrated circuit. If channel length is shortened, of course, width could be decreased. In other words, for a standard channel length, channel area should be tripled, or channel length correspondingly be shortened. What the preferred actual channel area or width should be will, of course, not be a constant. It will depend on the actual size of the RAM involved.

Figure 2:

For n-channel transistor integrated circuits, the silicon substrate would normally have a p-type resistivity of about 5–30 ohm-cm. In order to form one n-type channel between source region 18 and drain region 20 and another n-type channel between source region 24 and drain region 28, one must give the p-type substrate a phosphorus or arsenic implant in a dosage of at least about $1 \times 10^{14}$ ions/cm$^2$. One may want to choose a significantly higher dosage for the depletion implant, to insure a low resistivity path between the respective source and drain regions 18 and 20 and 26 and 28. However, in this invention we prefer to use a depletion implant only high enough to provide an adequately low resistance in the resultant depletion transistors. We choose to use the lower depletion implant because we wish to match it with the enhancement implant that is to be subsequently performed. Ordinarily we prefer to use a depletion implant dosage not greater than about $1 \times 10^{16}$ ions/cm$^2$. FIG. 2 refers to this implant.

Figure 3:
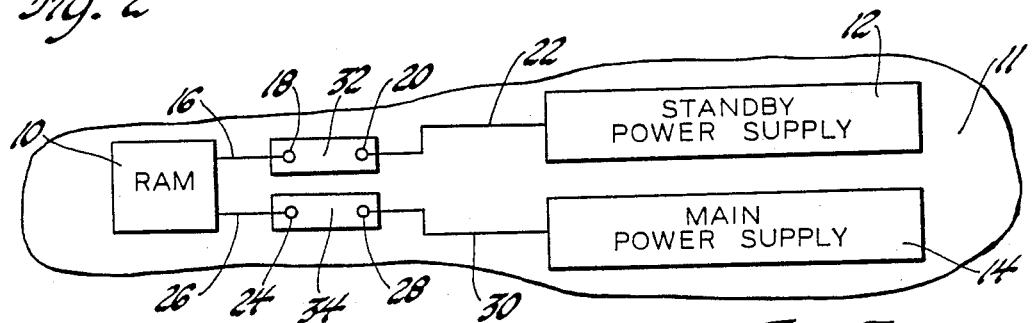
Figure 4:
Figure 5:

We prefer to make the depletion transistors referred to in FIG. 1 in the same manner as other depletion transistors would be made. For example, they would be made by ion implantation through an overlying polycrystalline gate electrode (not shown). Such an electrode would be disposed between source region 18 and gate region 20 of the first depletion type transistor 32. A similar electrode would be disposed between source region 24 and drain region 28 of the second transistor 34. In addition, the polycrystalline silicon gate electrode would be shorted to its source region by a buried contact. The completed depletion transistors are designated by the boxes 32 and 34 in FIG. 3. Each transistor has a conductive path between its source and drain regions with respect to the supply voltage that is to be applied. The gate-source short can be accomplished by delineating a polycrystalline silicon strip that crosses an active device area to form a gate electrode, bends back to the active device area, and contacts the source region. In plan view it appears U-shaped.

As previously mentioned, it is known to program a ROM in an integrated circuit by means of an enhancement implant late in the process of manufacturing the integrated circuit. The enhancement implant programs the ROM by raising the threshold voltage of some of the ROM transistors to a level above a predetermined operating voltage for the ROM. What the dosage should be will be a function of the original doping in the wafer used to start with. Usually the demand for a high dosage is not present.

On the other hand, in this invention the enhancement implant must be at least an order of magnitude greater than that of the depletion implant. Otherwise, the enhancement implant cannot increase the threshold voltage of the depletion transistors 32 and 34 enough to raise it above the operating voltage of the RAM. In fact, we prefer that the enhancement implant be at least two, and preferably three, orders of magnitude greater than that of the depletion implant. For example, if the depletion implant is of a dosage of about $1 \times 10^{14}$–$1 \times 10^{16}$ ions/cm$^2$, we prefer that the enhancement implant be of a dosage of about $1 \times 10^{17}$–$1 \times 10^{19}$ ions/cm$^2$.

Still further, matching dosages of the depletion and enhancement implants is not the only matching required in this invention. One must also match the diffusion rates of the impurity ions used in the depletion and enhancement implants. A slow diffusing ion such as phosphorus or arsenic is desired in the depletion implant. A fast diffusing ion such as boron or aluminum is desired for the enhancement implant. The reason for this is that the depletion implant is performed at an early stage in the process. It is performed before the integrated circuit is subjected to a number of heating steps. Upon heating, the depletion implant ions will diffuse to a depth greater than their initial implantation depth. In order to block the low resistance channel these ions form between the respective source and drain regions of transistors 32 and 34, the enhancement implant ions must end up almost as deep. We use the expression "almost as deep" because there is already a background concentration of ions of the same conductivity type in the substrate.

On the other hand presently available ion implant equipment does not have the power to implant ions as deeply as the depth to which the depletion implant ions have diffused at the enhancement implant stage of the process. Accordingly, additional heating is needed to diffuse the boron or aluminum ions to a depth almost as deep as the phosphorus or arsenic ions have diffused. By making the enhancement implant of ions which diffuse at least three times faster than the depletion implant ions, the enhancement implant ions can catch up to the depletion implant ions with only minimal heating after the enhancement implant. We may even prefer the enhancement implant ion to have a faster diffusion rate. It depends on the circuit parameters and process parameters. In any event, it will have to diffuse significantly faster. By significantly faster we mean fast enough to catch up with and compensate the depletion implant ions to substantially the full depth of their diffusion. Accordingly, in this invention not only are the depletion and enhancement implants matched, but they are coordinated with the balance of the process to provide means for diffusing the enhancement implant ions to a depth substantially as deep as that to which the depletion ions have diffused.

We much prefer that no heating steps be introduced into the process over those which would normally be used in making the integrated circuit. Otherwise concentrations of source and drain regions change, geometries of the source and drain regions expand, and electrical performance characteristics of individual devices and of the circuit as a whole can change considerably, usually undesirably. One may even have to expand the circuit layout. This would clearly be an undesirable effect if it can be avoided. Accordingly, in this invention we contemplate coordinating the enhancement implant with the balance of the steps in the process, so that the enhancement implant is performed early enough in the process to allow the remaining process steps to provide enough heat to cause the desired enhancement implant ion diffusion.

Sufficient heating after enhancement implant can be obtained if the enhancement implant is performed before deposition and reflow of a phosphosilicate glass on the chip. Such glasses are frequently used as a base layer onto which a metallization layer is deposited. In such instance, there will be more than enough heating of the integrated circuit to cause the aforementioned desired enhancement implant ion diffusion. For example, the phosphosilicate glass will be annealed at a temperature of about 1050° C. for about 8-10 minutes. In addition, one might choose to have an N+ deposition in the contact windows, which might be, for example, 30 minutes at 900° C. This deposition might be annealed for 30 minutes at 900° C., with a slow cool to 750° C. Still further, passivation coatings of plasma-deposited silicon nitride are ordinarily formed at temperatures of 350° C. to 400° C. for 45 minutes. Still further, the metal underlying the plasma nitride is generally annealed, frequently in a final integrated circuit fabrication step, at about 450° C. for 60 minutes. In such instance, no additional heating is required to produce an enhancement ion diffusion almost as deep as the depletion ion diffusion. However, if more diffusion is needed, it could readily be performed by extending the temperature and/or time of the metal anneal.

Figure 6:
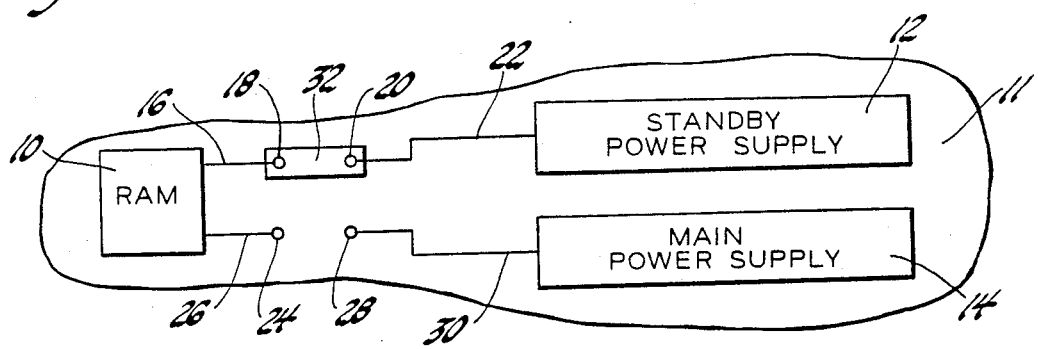

In summary, one initially produces an integrated circuit that has, for example, a RAM with at least two potential power supply paths to the RAM. Each potential path would have a depletion type insulated gate transistor serially connected in that path. However, one of the depletion transistors would have its channel doped with an impurity opposite to that of its source and drain. Doping would be high enough to raise threshold voltage of that channel high enough so that that transistor would not be operative at the voltage applied to that transistor. Such a transistor would literally then not be a depletion transistor. However, both such transistors would "look" like depletion transistors in the completed integrated circuit. By this we mean that each would have its source and gate electrically connected together via an extension of the polycrystalline silicon gate electrode. However, only the one that did not receive the enhancement implant would have a sufficiently conductive channel at the voltages applied. The programmed current supply paths are as shown in FIG. 6.

The embodiments of the invention in which an exclusive property or privilege is claimed are defined as follows:

1. In a method of making an integrated circuit having insulated gate field effect depletion and enhancement transistor types that are each given a separate ion implantation to respectively lower and raise their threshold voltages, the improvement of combining and matching the separate depletion transistor and enhancement transistor ion implantations to first parallel at least two alternative supply power paths in the circuit by means of the depletion implantation, and then block at least one of the paths by means of the enhancement implantation, whereby path selection for supply power can be reserved until late in the process of making the integrated circuit.

2. In a method of making an integrated circuit having insulated gate field effect depletion and enhancement type transistors that are each made with a separate ion implantation, the enhancement transistors being in a matrix programmed by their separate ion implantation, the improvement of matching the separate ion implantations with each other and coordinating them with subsequent heating to additionally form at least one low resistance serial connection in each of at least two electrically parallel alternative power supply paths in the circuit by means of the depletion implantation, and then to convert at least one of the connections to high resistance by means of the matched enhancement implantation and the subsequent coordinated heat treatment, effective to also allow programming of power supply circuitry when programming the enhancement transistor matrix in the integrated circuit.

3. In a method of making an integrated circuit having insulated gate field effect depletion and enhancement type transistors in a matrix that is given a first ion implantation to form the depletion transistors in the matrix and then a second ion implantation to program the enhancement transistors in the matrix, the improvement of providing a random-access memory in the integrated circuit, connecting the random-access memory with a standby power supply terminal and a main power supply terminal by paths electrically in parallel, serially including a low resistance depletion type transistor in each path, forming the depletion transistors with a moderate ion implant dosage and depth, exposing one of the power supply path depletion transistors to the enhancement transistor implant, tailoring the enhancement implant to be of a dosage at least an order of magnitude higher and of a depth at least as deep as that of the depletion implant and of ions that diffuse at least three times faster than those of the depletion implant, and subsequently heating the integrated circuit to cause the enhancement implant ions to diffuse as deeply as those of the depletion implant, effective to block current flow through the exposed power supply path depletion transistor.

4. In a method of making an integrated circuit having a read-only memory that includes depletion type n-channel insulated gate transistors of resistivity adjusted by ion implantation and a matrix of enhancement type n-channel insulated gate transistors, which matrix is programmed by ion implantation, the improvement of including in the integrated circuit a random-access memory, alternate power supply paths to the latter memory, and a large depletion transistor serially connected in each alternate path, implanting all the aforesaid depletion transistors with phosphorus ions in a dosage less than about $1 \times 10^{19}$ atoms/cc, exposing one of the depletion transistors in the alternate power supply path during the enhancement implant, implanting selected enhancement transistors and the expose-power supply path deflection transistor with boron ions in a dosage at least an order of magnitude higher than and to substantially a depth substantially as deep as that of the phosphorus implant, and then heating the integrated circuit during phosphosilicate glass reflow and transistor contact enhancement for a sufficient duration to also cause the boron ions to diffuse as deeply as the phosphorus ions, effective to make the one depletion transistor exposed during the enhancement implant inoperative at normal operating voltages.

* * * * *